United States Patent
Cai et al.

(10) Patent No.: US 9,691,886 B2
(45) Date of Patent: Jun. 27, 2017

(54) SEMICONDUCTOR-ON-INSULATOR (SOI) LATERAL HETEROJUNCTION BIPOLAR TRANSISTOR HAVING AN EPITAXIALLY GROWN BASE

(71) Applicant: INTERNATIONAL BUSINESS MACHINES CORPORATION, Armonk, NY (US)

(72) Inventors: Jin Cai, Cortlandt Manor, NY (US); Kevin K. Chan, Staten Island, NY (US); Christopher P. D'Emic, Ossining, NY (US); Tak H. Ning, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/984,575

(22) Filed: Dec. 30, 2015

(65) Prior Publication Data
US 2016/0300935 A1    Oct. 13, 2016

Related U.S. Application Data

(63) Continuation of application No. 14/684,669, filed on Apr. 13, 2015.

(51) Int. Cl.
*H01L 29/737*    (2006.01)
*H01L 29/10*    (2006.01)
(Continued)

(52) U.S. Cl.
CPC ...... *H01L 29/737* (2013.01); *H01L 21/76283* (2013.01); *H01L 27/082* (2013.01);
(Continued)

(58) Field of Classification Search
USPC ......... 257/198, 197, 47, 525, 526, 555, 565, 257/E31.069, E29.114
See application file for complete search history.

(56) References Cited

U.S. PATENT DOCUMENTS 5,473,172 A    12/1995    Nii
7,341,920 B2    3/2008    Khater
(Continued)

OTHER PUBLICATIONS

Office Action dated Aug. 3, 2016, received in a related U.S. Appl. No. 14/684,669.
(Continued)

*Primary Examiner* — Timor Karimy
(74) *Attorney, Agent, or Firm* — Scully, Scott, Murphy & Presser, P.C.; Louis J. Percello, Esq.

(57) ABSTRACT

A method of forming a semiconductor structure includes providing an emitter and a collector on a surface of an insulator layer. The emitter and the collector are spaced apart and have a doping of a first conductivity type. An intrinsic base is formed between the emitter and the collector and on the insulator layer by epitaxially growing the intrinsic base from at least a vertical surface of the emitter and a vertical surface of the collector. The intrinsic base has a doping of a second conductivity type opposite to the first conductivity type, and a first heterojunction exists between the emitter and the intrinsic base and a second heterojunction exists between the collector and the intrinsic base.

14 Claims, 7 Drawing Sheets

(51) Int. Cl.
    H01L 29/08     (2006.01)
    H01L 27/082    (2006.01)
    H01L 27/12     (2006.01)
    H01L 29/16     (2006.01)
    H01L 29/66     (2006.01)
    H01L 29/735    (2006.01)
    H01L 21/762    (2006.01)
    H01L 29/165    (2006.01)
    H01L 29/73     (2006.01)

(52) U.S. Cl.
    CPC ...... H01L 27/1203 (2013.01); H01L 29/0808 (2013.01); H01L 29/0817 (2013.01); H01L 29/0821 (2013.01); H01L 29/1008 (2013.01); H01L 29/16 (2013.01); H01L 29/6625 (2013.01); H01L 29/66242 (2013.01); H01L 29/735 (2013.01); H01L 29/165 (2013.01); H01L 29/66265 (2013.01); H01L 29/7317 (2013.01)

(56)         References Cited

U.S. PATENT DOCUMENTS 7,892,910 B2    2/2011   Feilchenfeld et al.
    8,288,758 B2   10/2012   Ning et al.
    8,441,084 B2    5/2013   Cai et al.
    8,502,347 B1    8/2013   Hekmatshoartabari et al.
    8,557,670 B1   10/2013   Cai et al.
    2012/0139009 A1*  6/2012  Ning .................. H01L 29/7317
                                                           257/197
    2013/0119516 A1   5/2013  Harame et al.

OTHER PUBLICATIONS

Sturm, J. C. et al., "A lateral Silicon-on-Insulator bipolar transistor with a self-aligned base contact," IEEE Electron Device Letters, vol. 8, 1987, pp. 104-106.

Comfort, J. H. et al., "Selective Extrinsic Base Deposition for an NTX SIGE HBT Process," IP.com No. 000112364, IBM Technical Disclosure Bulletin, vol. 37, No. 5, May 1994, pp. 51-54.

Mitrovic, I. Z. et al., "Review of SiGe HBTs on SOI," Solid-State Electronics, vol. 49, No. 9., 2005, pp. 1556-1567.

List of IBM Patents or Patent Applications Treated as Related, dated Dec. 30, 2015, 2 pages.

* cited by examiner

SEMICONDUCTOR-ON-INSULATOR (SOI) LATERAL HETEROJUNCTION BIPOLAR TRANSISTOR HAVING AN EPITAXIALLY GROWN BASE

BACKGROUND

The present application relates to a lateral heterojunction bipolar transistor (HBT) structure, and particularly to a lateral heterojunction bipolar transistor (HBT) including an epitaxial grown base and methods of manufacturing the same.

Heterojunction bipolar transistors (HBTs) include a heterojunction, i.e., a junction of two semiconductor materials having different band gaps, which coincide with a p-n junction between the base and the emitter. The wider band gap of the emitter relative to the band gap of the base in an HBT increases the current gain relative to a bipolar junction transistor employing a same semiconductor material across the base and the emitter and having similar physical dimensions and doping profiles for the base and emitter.

However, there can be difficulties associated with the manufacturing of the HBTs and with the functioning of HBTs. For instance, in the conventional art, the base is formed first which, in turn, may require additional patterning (e.g., lithography and reactive ion etching (RIE)) in order to enable deposition or epitaxial growth of the emitter/collector material to form an HBT having an emitter/collector including materials with a wider band gap than that for an intrinsic base, thereby resulting in a more complicated process for forming the HBT. Moreover, an HBT produced in the conventional art may also fail to provide sufficient isolation between the emitter and the extrinsic base and the collector and the extrinsic base.

SUMMARY

In accordance with an exemplary embodiment of the present application, a method of forming a semiconductor structure is provided. The method includes providing an emitter and a collector on a surface of an insulator layer, in which the emitter and the collector are spaced apart and have a doping of a first conductivity type. In addition, the method further includes forming an intrinsic base between the emitter and the collector and on the insulator layer by epitaxially growing the intrinsic base from at least a vertical surface of the emitter and a vertical surface of the collector. The intrinsic base has a doping of a second conductivity type opposite to the first conductivity type, and a first heterojunction exists between the emitter and the intrinsic base and a second heterojunction exists between the collector and the intrinsic base.

In accordance with an exemplary embodiment of the present invention, a semiconductor structure is provided. The semiconductor structure of this embodiment includes an emitter and a collector spaced apart from each other and located on an insulator layer. The emitter and the collector include a semiconductor material and have a doping of a first conductivity type. An intrinsic base is disposed in between the emitter and the collector and on the insulator layer. The intrinsic base includes a semiconductor material and has a doping of a second conductivity type which is opposite to the first conductivity type.

In addition, the HBT further includes an extrinsic base disposed on a top surface of the intrinsic base. The bottom surface of the extrinsic base has an epitaxial relationship with the top surface of the intrinsic base. Also, the intrinsic base contacts the emitter, the collector and the extrinsic base. Moreover, the intrinsic base has an energy band gap less than an energy band gap of the emitter and an energy band gap of the collector.

In accordance with another exemplary embodiment, another semiconductor structure is provided. The another semiconductor structure includes an emitter and a collector located on the insulator layer. The emitter and the collector include a semiconductor material and have a doping of a first conductivity type. A seed layer is located between and in contact with the emitter and the collector and on the insulator layer. The seed layer includes a semiconductor material and has a doping of a second conductivity type opposite to the first conductivity type.

In addition, the another semiconductor structure further includes an intrinsic base located between the emitter and the collector and on a top surface of the seed layer, in which the intrinsic base includes a semiconductor material and has a doping of the second conductivity type. Further, the semiconductor structure also includes an extrinsic base located on a top surface of the intrinsic base. The bottom surface of the extrinsic base has an epitaxial relationship with the top surface of the intrinsic base. Moreover, the intrinsic base contacts the emitter, the collector, the seed layer, and the extrinsic base. Also, the intrinsic base has an energy band gap less than an energy band gap of the emitter and an energy band gap of the collector.

DETAILED DESCRIPTION

Figure 1A:
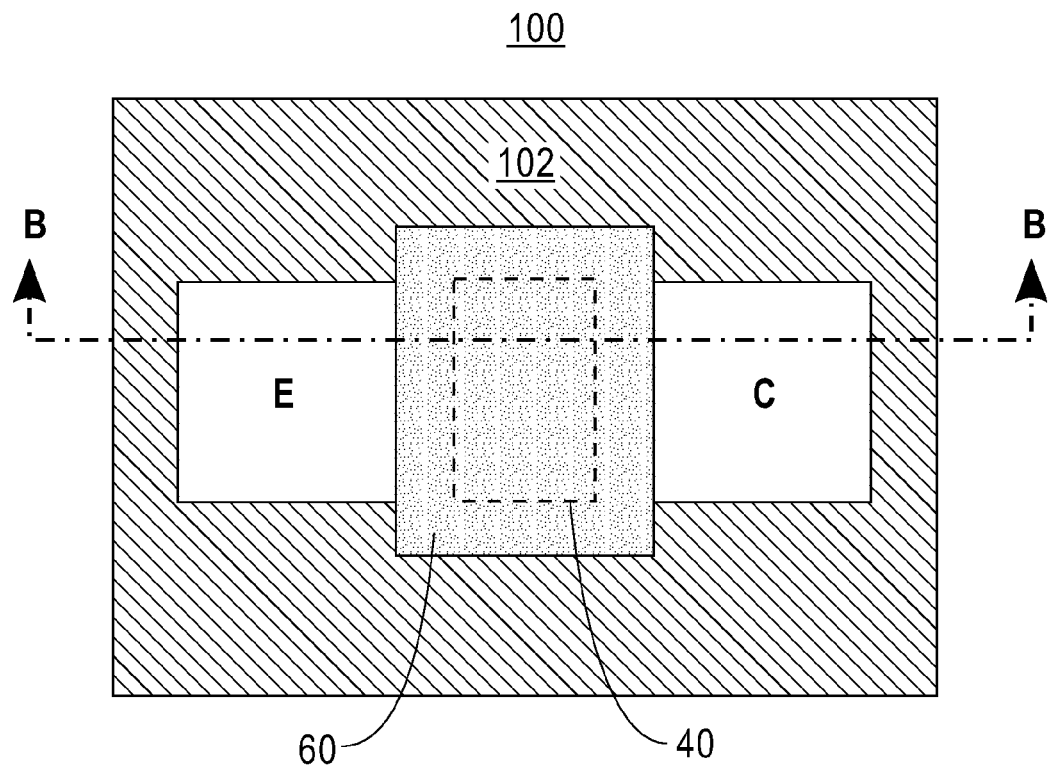
FIG. 1A is a top down view of a heterojunction bipolar transistor (HBT) according to a first embodiment of the present application.

As stated above, the present application relates to a lateral heterojunction bipolar transistor (HBT) including an epitaxial grown base and methods of manufacturing the same, which are now described in detail with accompanying figures. It is noted that like and corresponding elements mentioned herein and illustrated in the drawings are referred to by like reference numerals.

Figure 1B:
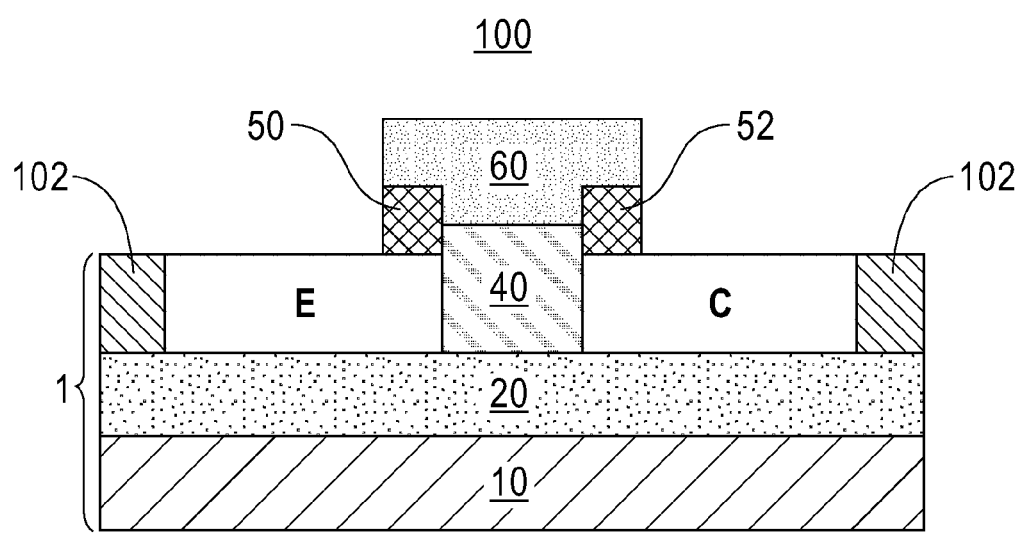
FIG. 1B is a vertical cross-sectional view of the exemplary semiconductor structure along vertical plane B-B of FIG. 1A.

Referring first to FIGS. 1A-1B, there is shown an SOI lateral HBT 100 ("hereinafter HBT 100") in accordance with a first embodiment of the present application. For illustration purposes, the HBT 100 of the present exemplary embodiment will be described herein as an npn transistor, having an n-type emitter, a p-type base and an n-type collector. However, it should be understood that the HBT 100 could contrarily comprise a pnp transistor with opposite doping types in other embodiments.

The HBT 100 exemplified in FIGS. 1A-1B includes, for example, a semiconductor-on-insulator (SOI) substrate 1. The SOI substrate 1 includes a handle substrate 10, an insulator layer 20 contacting a top surface of the handle substrate 10, and a top semiconductor layer 30 contacting a top surface of the insulator layer 20. It is noted that FIGS. 1A-1B do not show the top semiconductor layer 30 of the SOI substrate 1 because the SOI substrate 1 in these drawings was already processed to transform the top semiconductor layer 30 into emitter E and collector C. In any event, the SOI substrate 1, which includes the top semiconductor layer 30 prior to processing the SOI substrate 1, can be found in FIG. 2.

The handle substrate 10 may comprise a semiconductor material. The semiconductor material of the handle substrate 10 can include, but is not limited to, silicon (Si), silicon germanium (SiGe), silicon germanium carbide (SiGeC), silicon carbide (SiC), an III-V compound semiconductor, an II-VI compound semiconductor or any combinations thereof. Multilayers of semiconductor materials can also be used as the semiconductor material of the handle substrate 10. In one embodiment, the handle substrate 10 is comprised of silicon. In some embodiments, the handle substrate 10 is a non-semiconductor material including, for example, a dielectric material and/or a conductive material. In yet other embodiments, the handle substrate 10 can be omitted and a substrate including the insulator layer 20 and the top semiconductor layer 30 can be used in the present application.

The insulator layer 20 of the SOI substrate 1 may include a dielectric material such as, for example, silicon dioxide, silicon nitride, or any other suitable insulating materials or combinations thereof. In an embodiment, the insulator layer 20 may be, for example, a buried oxide layer (BOX). The thickness of the insulator layer 20 can be, for example, from 5 nm to 1000 nm, and typically from 100 nm to 200 nm, although lesser and greater thicknesses can also be employed. The insulator layer 20 may, or may not, include multiple dielectric layers, e.g., a stack including at least a silicon dioxide layer and a silicon nitride layer.

The HBT 100 further includes, an emitter E, a collector C spaced apart from the emitter E, and a trench isolation structure 102 (e.g., a shallow trench isolation (STI)) which defines boundaries of the HBT 100 within the SOI substrate 1. The trench isolation structure 102 laterally surrounds and contacts the emitter E and the collector C. The trench isolation structure 102 in the present embodiment is a STI trench formed by, for example, conventional shallow trench isolation (STI) formation techniques. Moreover, the trench isolation structure 102 includes a dielectric material such as, for example, silicon dioxide, silicon nitride, and/or silicon oxynitride, or any other suitable isolation material or combination thereof. As described in further detail below in connection with methods for fabricating the HBT 100 of the present embodiment, the emitter E and the collector C are each formed by patterning and doping the top semiconductor layer 30. In the present embodiment, the emitter E and the collector C each have an n-type conductivity, but exemplary embodiments are not limited thereto. "N-type" refers to an impurity, i.e., dopant, that is added to an intrinsic semiconductor material that contributes free electrons to the intrinsic semiconductor material. In other embodiments, the emitter region E and the collector region C may instead alternatively each have a p-type conductivity. "P-type" refers to an impurity, i.e., dopant, that creates deficiencies of valence electrons. The emitter E and the collector C, which are formed in the top semiconductor layer 30 of the SOI substrate 1 shown in FIG. 2 may be composed of one of the semiconductor materials mentioned above for the handle substrate 10.

In addition, the HBT 100 further includes an intrinsic base 40 disposed on the insulator layer 20 and in between the emitter E and the collector C. The intrinsic base 40 may include any semiconductor material so long as the energy band gap of the semiconductor material used for the intrinsic base 40 is smaller than the energy band gaps of each of the emitter E and the collector C. For example, the intrinsic base 40 may include a semiconductor material such as Si, SiGe, SiGeC, SiC, or a combination thereof. By the intrinsic base 40 having a smaller energy band gap than the energy band gaps of the emitter E and the collector C, a first heterojunction may be created between the emitter E and the intrinsic base 40, and a second heterojunction may be created between the collector C and the intrinsic base 40. The doping concentration profile across the thickness of the intrinsic base 40 may be, for example, uniform or graded.

In the present embodiment, the intrinsic base 40 has, for example, a p-type conductivity and includes SiGe but exemplary embodiments are not limited thereto. Alternatively, and in another embodiment, the intrinsic base 40 may instead include an n-type conductivity and the emitter E and the collector C can include a p-type conductivity. Also, and in another embodiment, the intrinsic base 40 may be formed of a semiconductor material other than SiGe.

In some embodiments, the intrinsic base 40 can be epitaxially grown from a vertical surface (e.g., inner vertical sidewall 70) of the emitter E and from a vertical surface (e.g., inner vertical sidewall 72) of the collector C as described in further detail below in connection with the methods for fabricating the HBT 100 of the present embodiment illustrated in FIGS. 6-7. In the present embodiment, the intrinsic base 40 is epitaxially grown such that an upper portion thereof protrudes above the top surface of the emitter E and the collector C (i.e., the top surface of the intrinsic base 40 has a greater height than the top surface of either the emitter E or the collector C). Each of the emitter E and collect C of the HBT 100 of the present application has a top surface that is coplanar with each other.

Also, in the present embodiment, the intrinsic base 40 fills a gap between emitter E and the collector C and contacts the inner vertical sidewalls 70, 72 of the emitter E and the collector C. In addition, the energy band gap of the intrinsic base 40 is smaller than the energy band gaps of the emitter E and the collector C. In the present embodiment, the doping concentrations of each of the emitter E and the collector C are greater than the doping concentration of the intrinsic base 40, but exemplary embodiments are not limited thereto. For example, and in other embodiments, the doping concentration of the intrinsic base 40 may be greater than the doping concentrations of the emitter E and the collector C, so long as the energy band gap of the intrinsic base 40 is smaller than the energy band gaps of the emitter E and the collector C. By the intrinsic base 40 having a smaller energy band gap than the energy band gaps of the emitter E and the collector C, a first heterojunction may be created between the emitter E and the intrinsic base 40, and a second heterojunction may be created between the collector C and the intrinsic base 40.

Moreover, the HBT 100 of the present application further includes an extrinsic base 60 disposed on a top surface of the intrinsic base 40. As described in further detail below in the method for fabricating the HBT 100 illustrated in FIG. 8, the extrinsic base 60 is epitaxially grown on top of the intrinsic base 40, and a contact surface (e.g., a bottom surface) of the extrinsic base 60 has an epitaxial relationship with a growth surface (e.g., a top surface) of the intrinsic base 40. As used herein, the expression "epitaxial relationship with" denotes that a contact surface of a first element has a same crystal orientation as the growth surface of the second element.

The extrinsic base 60 may include a semiconductor material such as, for example, Si, SiGe, SiGeC, SiC, or a combination thereof. The doping concentration profile across the thickness of the extrinsic base 60 may be, for example, uniform or graded. Also, in embodiments in which the intrinsic base 40 and the extrinsic base 60 are composed of a same semiconductor material, the energy band gap of the semiconductor material in the intrinsic base 40 may still be less than the energy band gap of the semiconductor material in the extrinsic base 60 by adjusting the content of constituent elements in the semiconductor material of the intrinsic base 40 and the extrinsic base 60. For example, and in an embodiment of the present application, the intrinsic base 40 may include SiGe with 50% Ge, and the extrinsic base 60 may include SiGe with 10% Ge such that the energy band gap of the SiGe in the intrinsic base 40 is less than the energy band gap of the SiGe in the extrinsic base 60.

In the present embodiment, the extrinsic base 60 has p-type conductivity. Alternatively, and in an embodiment, the extrinsic base 60 may have an n-type conductivity and the emitter E and the collector C can have a p-type conductivity. Also, in the present embodiment, the extrinsic base 60 can be more heavily doped than the intrinsic base 40. In some embodiments, the extrinsic base 60 also has an energy band gap which is larger than the energy band gap of the intrinsic base 40. Alternatively, and in an embodiment, the extrinsic base 60 is more heavily doped than the intrinsic base 40, and the extrinsic base 60 may have an energy band gap which is the same as the energy band gap of the intrinsic base 40.

Further, the HBT 100 of the present application also includes a first vertical spacer 50 which is in contact with a portion of the top surface of the emitter E, a first vertical surface of the intrinsic base 40, and a portion of the extrinsic base 60 so as to isolate the emitter E from the extrinsic base 60. The HBT 100 further includes a second vertical spacer 52 which is in contact with a portion of the top surface of the collector C, a second vertical surface of the intrinsic base 40, and a portion of the extrinsic base 60 so as to isolate the collector C from the extrinsic base 60. The first and second vertical spacers 50, 52 may be formed of a dielectric material. In an embodiment, the first and second vertical spacers 50, 52 are formed of, for example, silicon dioxide, silicon nitride, silicon oxynitride, or silicon nitride composite. In another embodiment, the first and second vertical spacers 50, 52 may be formed of a low-k dielectric material (i.e. material having a low dielectric constant relative to the dielectric constant of $SiO_2$).

The first vertical spacer 50 and the second vertical spacer 52 may each have a thickness of, for example, 10 nm to 100 nm. In addition, the height of the top surface of the first vertical spacer 50 and the height of the top surface of the second vertical spacer 52 are greater than the height of the top surface of the intrinsic base 40 such that the top surface of the first vertical spacer 50 and the top surface of the second vertical spacer 52 each extend beyond the top surface of the intrinsic base 40.

Reference is now made to FIGS. 2-8, which illustrate a method for fabricating the HBT 100 shown in FIGS. 1A-1B according to the first embodiment of the present application. Specifically, and referring to FIG. 2, an SOI substrate 1 is first provided. In the present embodiment, the SOI substrate 1 includes, for example, the handle substrate 10, the insulator layer 20 (e.g., BOX) contacting a top surface of the handle substrate 10, and a top semiconductor layer 30 contacting the top surface of the insulator layer 20.

The SOI substrate 1 may be fabricated using techniques well known to those skilled in the art. For example, the SOI substrate 1 may be formed by conventional processes including, but not limited to, Separation by Implanted Oxygen (SIMOX) process, which employs high dose ion implantation of oxygen and high temperature annealing to form insulator layer 20 (e.g., BOX layer) in a bulk wafer, or wafer bonding. The SOI substrate 1 may also be formed using other processes. The method of fabricating the SOI substrate 1 is not critical to the present application.

In one embodiment and as mentioned above, the handle substrate 10 may include any semiconductor material. In one example, the handle substrate 10 may include Si, SiGe, SiGeC, SiC, or a combination thereof. In another example, the handle substrate 10 may alternatively include a non-semiconductor material such as a dielectric material and/or conductive material. Insulator layer 20 may include, for example, a dielectric material such as, for example, silicon dioxide, silicon nitride, or any other suitable insulating material or combination thereof.

The top semiconductor layer 30 may include any semiconductor material as mentioned above for the handle substrate 10. In one embodiment, the semiconductor material that provides the top semiconductor layer 30 can be a same semiconductor material as that which provides the handle substrate 10. In another embodiment, the semiconductor material that provides the top semiconductor layer 30 can be a different semiconductor material than that which provides the handle substrate 10. In one example, the top semiconductor layer 30 may include a silicon containing semiconductor material such as Si, SiGe, SiGeC, SiC, or a combination thereof. Non-silicon containing semiconductor materials such as, for example, Ge, an III-V compound semiconductor and/or an II-VI compound semiconductor may also be used as the semiconductor material that provides the top semiconductor layer 30. In some embodiments, the top semiconductor layer 30 includes a crystalline semiconductor material such as, for example, single crystal silicon. In one example, the thickness of the top semiconductor layer 30 of the SOI substrate 1 can be from 10 nm to 500 nm. In another example, the thickness of the top semiconductor layer 30 of the SOI substrate 1 can be from 50 nm to 70 nm. Other thicknesses that are lesser than, or greater than, the aforementioned thicknesses ranges may also be used as the thickness of the top semiconductor layer 30.

Figure 3A:
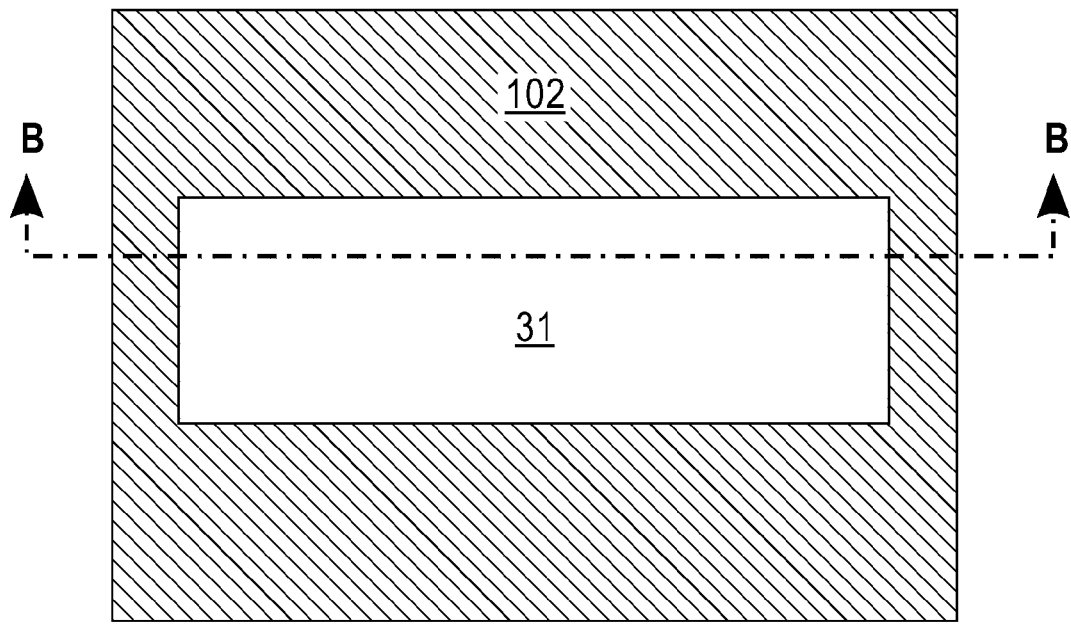
FIG. 3A is a top down view of the exemplary semiconductor structure of FIG. 2 after forming a trench isolation structure in a top semiconductor layer of the SOI substrate.
Figure 3B:
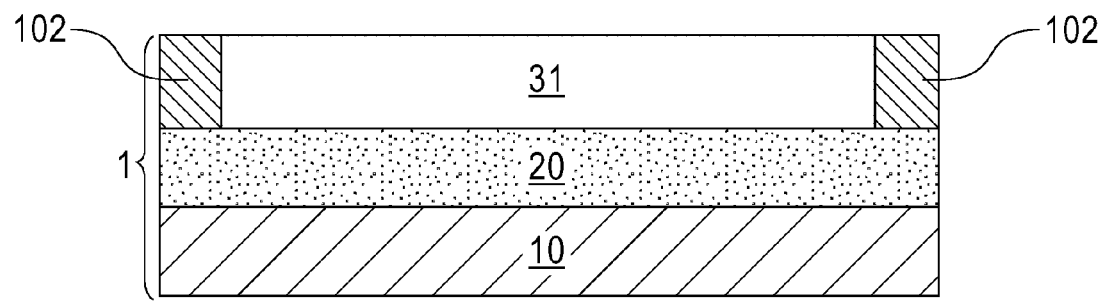
FIG. 3B is a vertical cross-sectional view of the exemplary semiconductor structure along vertical plane B-B of FIG. 3A.

Next, referring to FIGS. 3A-3B, the top semiconductor layer 30 can be processed to include a trench isolation structure 102. In one embodiment, the trench isolation structure 102 can be formed utilizing a trench isolation process. The trench isolation process may include, for example, patterning the top semiconductor layer 30 by lithography and etching, to provide a trench in the top semiconductor layer 30. The trench is then filled with a trench dielectric material such as, for example, silicon dioxide. A planarization process can follow the trench fill. The trench isolation structure 102 that is formed extends completely through the top semiconductor layer 30, stopping on a top surface of the insulator layer 20. The trench isolation structure 102 also laterally surrounds and contacts an unetched region (i.e., a remaining portion) of the top semiconductor layer 30, which is herein referred to as a top semiconductor portion 31.

In one embodiment of the present application, the top semiconductor portion 31 includes Si and is doped with an electrical dopant having an n-type conductivity type such as, for example, phosphorus (P), arsenide (As), and/or antimony (Sb). In such an embodiment, the top semiconductor portion 31 has doping of an n-conductivity type. Alternatively, the top semiconductor portion 31 may be doped with an electrical dopant having a p-type conductivity type such as, for example, boron (B), aluminum (Al), gallium (Ga), and/or indium (In). In such an embodiment, the top semiconductor portion 31 has doping of a p-conductivity type. In other embodiments of the present application, the top semiconductor portion 31 may include semiconductor materials other than Si.

The dopants that provide the conductivity type to the top semiconductor portion 31 can be provided by utilizing one of ion implantation and gas phase doping. Alternatively, and in an embodiment of the present application, the top semiconductor layer 30 may have been doped prior to forming the top semiconductor portion 31.

Figure 4:
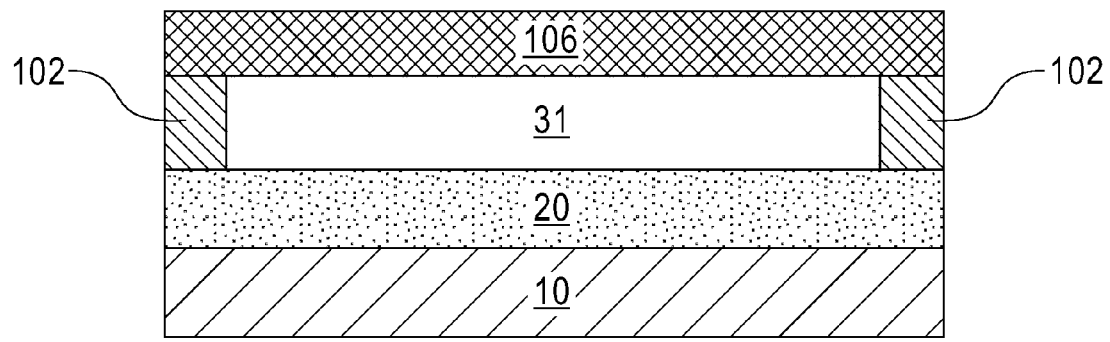
FIG. 4 is a vertical cross-sectional view of the exemplary semiconductor structure of FIGS. 3A-3B after forming an insulating layer on a top surface of a top semiconductor portion and a top surface of the trench isolation structure.

Next, as shown in FIG. 4, an insulating layer 106 is formed on a top surface of the top semiconductor portion 31 and a top surface of the trench isolation structure 102. The insulating layer 106 may include a dielectric material such as for example, an oxide, nitride or a combination thereof. For example, and in an embodiment of the present application, the insulating layer 106 may include silicon nitride, silicon dioxide and/or silicon oxynitride. The insulating layer 106 may be formed on the top semiconductor portion 31 utilizing a deposition process such as, for example, chemical vapor deposition or plasma enhanced chemical vapor deposition (PECVD).

Figure 5A:
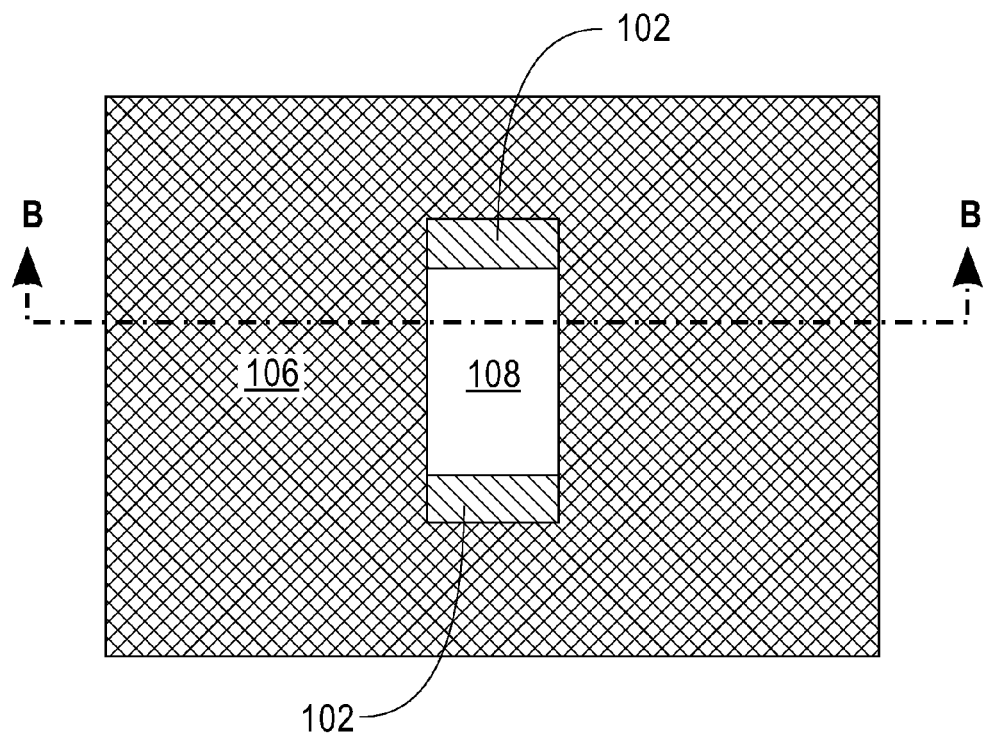
FIG. 5A is a top down view of the exemplary semiconductor structure of FIG. 4 after forming an opening in the insulating layer.
Figure 5B:
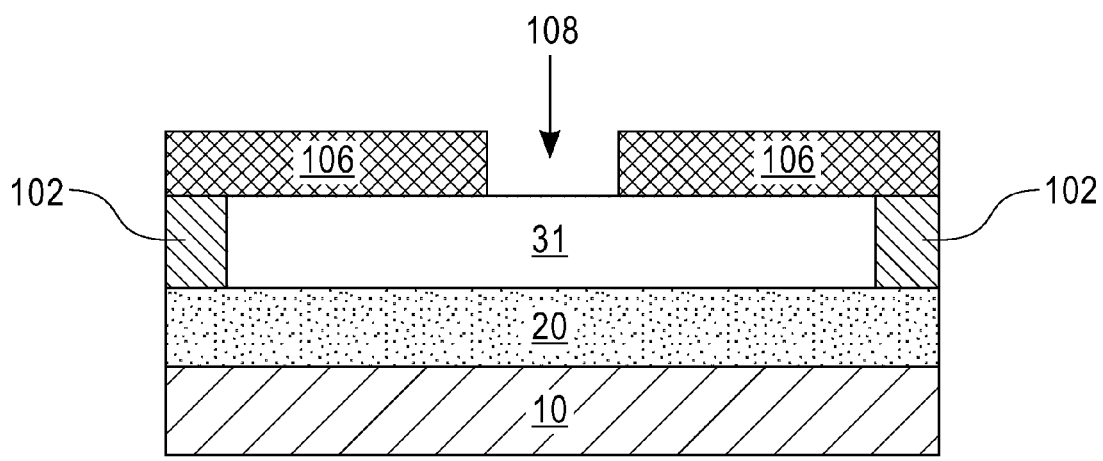
FIG. 5B is a vertical cross-sectional view of the exemplary semiconductor structure along vertical plane B-B of FIG. 5A.

Next, as shown in FIGS. 5A-5B, the insulating layer 106 may be patterned to provide opening 108. The patterning of the insulating layer 106 may include lithography and etching. The etch used to provide the opening 108 may include an anisotropic etch such as, for example, reactive ion etching (RIE). Opening 108 that is formed exposes a top surface of the top semiconductor portion 31. In some embodiments, a plurality of openings 108 can be formed at this point of the present application.

Figure 6:
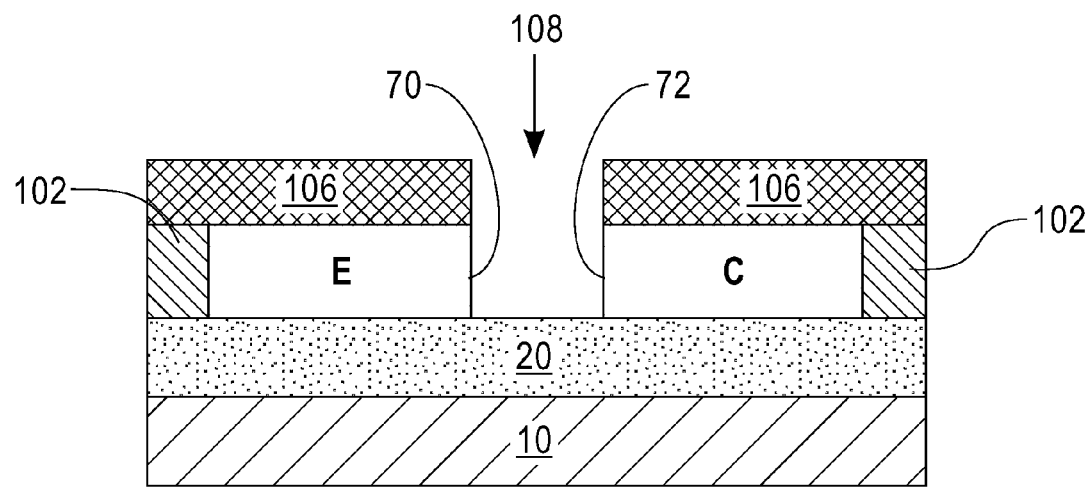
FIG. 6 is a vertical cross-sectional view of the exemplary semiconductor structure of FIGS. 5A-5B after a recess is formed completely through the top semiconductor portion stopping on a top surface of an insulator layer.

Referring now to FIG. 6, there is illustrated the exemplary semiconductor structure of FIGS. 5A-5B after forming a recess. The recess is formed completely through the top semiconductor portion 31, stopping on the top surface of the insulator layer 20 using a conventional etching process. For example, and in the present exemplary embodiment, an RIE process using the insulating layer 106 as an etch mask is performed to etch all the way through the top semiconductor portion 31 thereby exposing a portion of the top surface of insulator layer 20 and also forming an emitter E and a collector C which are spaced apart from each other and are located on the insulator layer 20.

Figure 7:
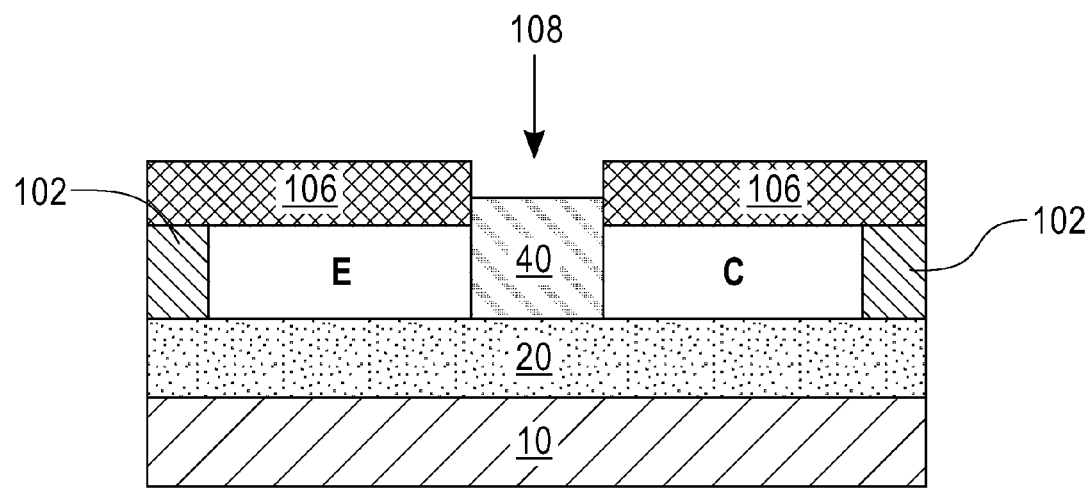
FIG. 7 is a vertical cross-sectional view of the exemplary semiconductor structure of FIG. 6 after performing an epitaxial growth process in which an inner sidewall of an emitter and an inner sidewall of a collector together operate as a seed for growing an intrinsic base from the inner vertical sidewalls of the emitter and the collector.

Next, as shown in FIG. 7, an epitaxial growth process, such as, for example, a selective epitaxial growth process (SEG), is performed in which an inner vertical sidewall 70 of the emitter E and an inner vertical sidewall 72 of the collector C together operate as a seed for growing the intrinsic base 40 from the inner vertical sidewalls, 70, 72 of the emitter E and the collector C. In the present embodiment, the intrinsic base 40 may be, for example, simultaneously formed from the inner vertical sidewalls 70, 72 of the emitter E and the collector C. Moreover, the intrinsic base 40 formed by the SEG process is disposed on the insulator layer 20 and substantially fills a gap between the emitter E and the collector C and contacts the inner vertical sidewalls 70, 72 thereof. In addition, and in the present embodiment, the intrinsic base 40 protrudes above the emitter E and the collector C and into the opening 108 in the insulating layer 106. More specifically, and in the present embodiment, the height of the top surface of the intrinsic base 40 may be greater than the height of the top surface of the emitter E and the top surface of the collector C, and the height of the top surface of the intrinsic base 40 may also be greater than the height of the bottom surface of the opening 108 in the insulating layer 106 but less than the height of the top surface of the opening 108 in the insulating layer 106.

The intrinsic base 40 may be doped in-situ during the epitaxial growth process or, alternatively, by a subsequent ion implantation process after growth of an intrinsic semiconductor material. In the present embodiment, the intrinsic base 40 is doped with a p-type conductivity and includes SiGe as the semiconductor material, but exemplary embodiments are not limited thereto. Other semiconductor materials besides SiGe can be used in providing the intrinsic base 40 of the present application so long as the energy band gap of the semiconductor material that provides the intrinsic base 40 is less than the band gap of the semiconductor materials that provides the emitter E and collector C. Alternatively, and in other embodiments, the intrinsic base 40 may have an n-type conductive if a pnp heterojunction bipolar transistor is desired.

Figure 8:
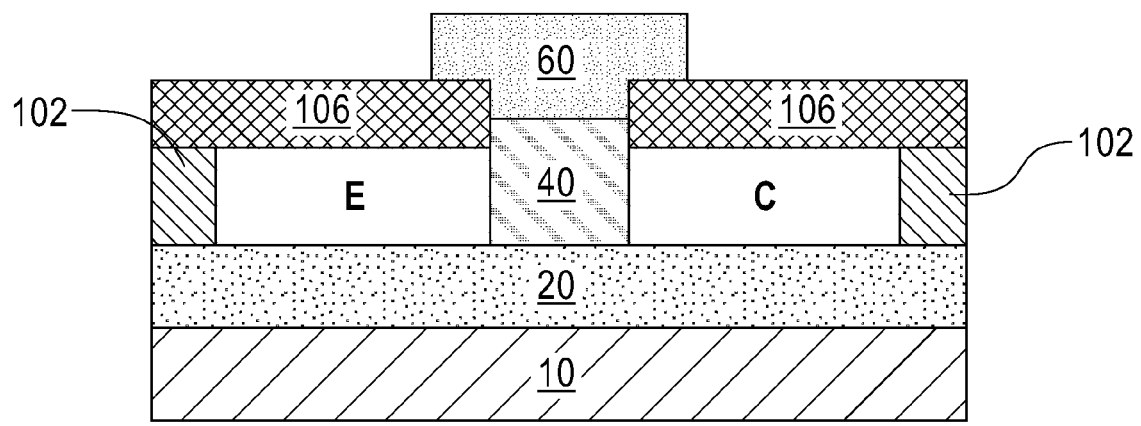
FIG. 8 is a vertical cross-sectional view of the exemplary semiconductor structure of FIG. 7 after performing an epitaxial growth process to form an extrinsic base on a top surface of the intrinsic base and overlapping onto portions of the insulating layer.

Referring now to FIG. 8, there is shown the exemplary semiconductor structure of FIG. 7 after epitaxially growing the extrinsic base 60 from the top surface (e.g., growth surface) of the intrinsic base 40. In accordance with the present application, the extrinsic base 60 that is formed has an epitaxial relationship with the top surface of the intrinsic base 40. Consequently, the intrinsic base 40 and the extrinsic base 60 may be formed utilizing a single epitaxial growth process. In addition, and in the present embodiment, the extrinsic base 60 is overgrown such that it overlaps onto the insulator layer 106 that defines the opening 108. In the present embodiment, the extrinsic base 60 has a p-type conductivity. Alternatively, and in another embodiment, the extrinsic base 60 may instead have an n-type conductivity in the case of a pnp HBT. The extrinsic base 60 may include, for example, Si, SiGe, SiGeC, SiC, or a combination thereof. In the present embodiment, the extrinsic base 60 typically has a greater energy band gap than the energy band gap of the semiconductor material of the intrinsic base 40. For example, and in an embodiment, the intrinsic base 40 includes SiGe and the extrinsic base 60 includes Si. In another example, the intrinsic base 40 includes SiGe with 50% Ge, and the extrinsic base 60 includes SiGe with 10% Ge. In some embodiment, the extrinsic base 60 is more heavily doped than the intrinsic base 40, and the extrinsic base may have an energy band gap which is the same as the energy band gap of the intrinsic base 40.

Also, the doping concentration of the extrinsic base 60 may be greater than the doping concentration of the intrinsic base 40 in the present exemplary embodiment but exemplary embodiments are not limited thereto. For example, and in an alternative embodiment of the present application, the extrinsic base 60 and the intrinsic base may have the same doping concentration as each other. The extrinsic base 60 can be doped, for example, in-situ, or alternatively by ion implantation after growth.

Next, portions of insulating layer 106 located above the emitter E and the collector C are removed from the exemplary semiconductor structure of FIG. 8 using the extrinsic base 60 as an etch mask to form the HBT 100 of FIGS. 1A-1B of the first embodiment of the present application. The removal of portions of the insulator layer 106 that are not protected by the extrinsic base 60 can be performed utilizing an etching process such as, for example, dry etching or wet chemical etching. The remaining portions of the insulating layer 106 may be referred to as a first vertical spacer 50 and a second vertical spacer 52. The first vertical spacer 50 is in contact with a portion of the top surface of the emitter E and in contact with a first vertical surface of the intrinsic base 40, and the second vertical spacer 52 is in contact with a portion of the top surface of the collector C and in contact with a second vertical surface of the intrinsic base 40. In addition, the first vertical spacer 50 may overlap and contact with a first portion of the extrinsic base 60, and the second vertical spacer 52 may overlap with and contact with a second portion of the extrinsic base 60. The first vertical spacer 50 isolates the emitter E from the extrinsic base 60, and the second vertical spacer 52 isolates the collector C from the extrinsic base 60.

Optionally, self-aligned metal semiconductor alloy contacts (not shown) can be formed on the exposed emitter E, collector C and extrinsic base 60 surfaces by utilizing a conventional self-aligned metal semiconductor alloy contact formation process that includes, for example, deposition of a metal such as nickel (Ni), platinum (Pt), cobalt (Co), or titanium (Ti), and annealing. In embodiments in which the emitter E and collector C are both composed of silicon, a metal silicide contact may form. Thereafter, unreacted metal is removed, by etching selective to the metal semiconductor alloy contact leaving the metal semiconductor alloy contact in place.

Figure 9:
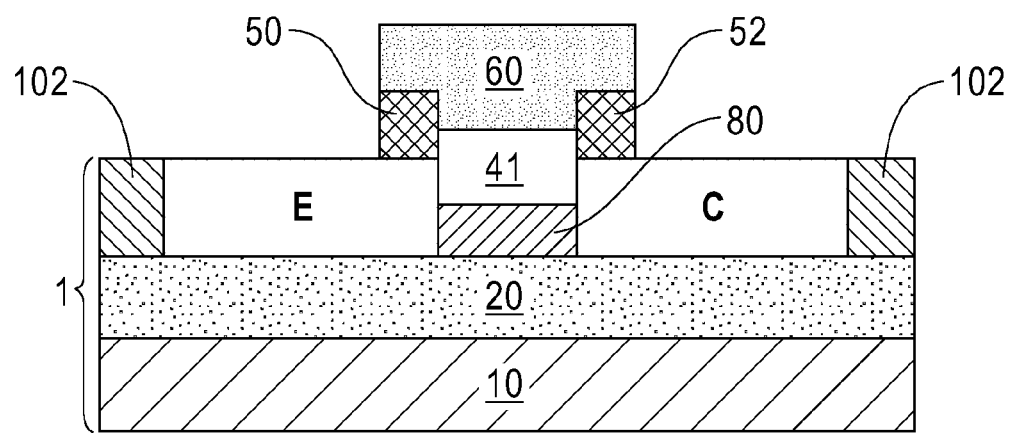
FIG. 9 is a vertical cross-sectional view of a semiconductor structure according to a second embodiment of the present application.

Now referring to FIG. 9, there is illustrated a semiconductor structure 200 in accordance with a second embodiment of the present application. The semiconductor structure 200 includes two lateral bipolar transistors operating in parallel, as explained below. The same reference numerals will be used in this embodiment in the detailed description and the drawings to refer to the same elements in common with the first embodiment. Moreover, for the sake of brevity, elements of the first embodiment in common with the present embodiment will not be described again in detail in connection with the present embodiment but rather only the differences between the first embodiment and the present embodiment will be described in detail.

The semiconductor device structure 200 of the present embodiment includes an SOI substrate 1 including a handle substrate 10 and an insulator layer 20 located on a top surface of the handle substrate 10. The semiconductor device structure 200 further includes an emitter E and a collector C spaced apart from each other on a top surface of the insulator layer 20, and a trench isolation structure 102 which laterally surrounds and contacts lateral surfaces of the emitter E and the collector C. In the present embodiment, the emitter E and the collector C include n-doped silicon but exemplary embodiments are not limited thereto. Alternatively, and in an embodiment of the present, the emitter E and collector C can have a p-type conductivity.

In addition, the semiconductor device structure 200 further includes a seed layer 80 which is formed from the same layer as the emitter E and the collector C but has an opposite conductivity type (e.g., p-type conductivity) to the conductivity type (n-type conductivity) of the emitter E and the collector C. For example, the emitter E, the collector C and the seed layer 80 all include Si. Moreover, in the present embodiment, the emitter E, the collector C and the seed layer 80 together constitute a bottom transistor of the semiconductor device structure 200 which is an all silicon transistor.

Further, the semiconductor device structure 200 also includes an intrinsic base 41 disposed on the seed layer 80 in a gap between the emitter E and the collector C. The intrinsic base 41 of the present embodiment and the intrinsic base 40 of the first embodiment are similar to each other, except for the slightly different way they are each formed. In particular, the intrinsic layer 41 in the present embodiment is grown from the seed layer 80, the inner vertical sidewall of the emitter E and the inner vertical sidewall of the collector C (See FIGS. 10-11). As discussed above in connection with the first embodiment, the intrinsic layer 40 is only grown from the inner vertical sidewall 70 of the emitter E and the inner vertical sidewall 72 of the collector C. Other than the above mentioned difference, the intrinsic base 41 of the present embodiment and the intrinsic base 40 of the first embodiment are essentially the same. Here, in the present embodiment, the intrinsic base 41 includes a semiconductor material having an energy band gap which is less than the energy bandgap of either the emitter E or the collector C such as, for example, SiGe. However, in alternate embodiments, semiconductor materials other than SiGe may be used to form the intrinsic base 41 so long as the energy band gap of the material used to form the intrinsic base 41 is less than the energy band gaps of the materials used to form the emitter E and the collector C. The intrinsic base 41 in the present embodiment has a p-type conductivity. Alternatively, in an embodiment, the intrinsic base 41 may instead have an n-type conductivity and the emitter E and the collector C may have a p-type conductivity.

Moreover, the semiconductor device structure 200 also includes a first vertical spacer 50 and a second vertical spacer 52. As in the first embodiment, the first vertical spacer 50 isolates the emitter E from the extrinsic base 60, and the second vertical spacer 52 isolates the collector C from the extrinsic base 60.

In addition, the extrinsic base 60 in the present embodiment is epitaxially grown from the top surface of the intrinsic layer 41 in the same manner as the extrinsic base 60 described in the first embodiment. Moreover, the extrinsic base 60 may include the same material, doping conductivity and dopant concentration as the extrinsic base 60 of the first embodiment.

The emitter E, collector C and the intrinsic base 41 in the present embodiment constitute a top HBT transistor of the semiconductor structure 200. Moreover, as discussed above, in the present embodiment, the emitter E and the collector C include silicon and the intrinsic base includes SiGe but exemplary embodiments are not limited thereto.

The transistor characteristics of the two lateral bipolar transistors operating in parallel of the semiconductor structure 200 may be dominated by the upper HBT transistor, because of the smaller band gap of the intrinsic base 41.

A method for forming the semiconductor structure 200 of the second embodiment will now be described in detail below. Many of the same processing steps used to form the HBT 100 of the first embodiment may also be used to form the semiconductor structure 200 of the present embodiment, except for steps illustrated in FIGS. 6-7 of the first embodiment which are replaced by the process steps illustrated in FIGS. 10 and 11 as explained in further detail below.

Figure 2:
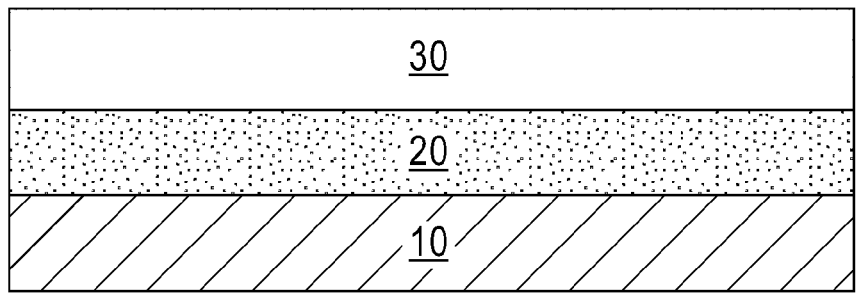
FIG. 2 is a vertical cross-sectional view of an exemplary semiconductor structure including a semiconductor-on-insulator (SOI) substrate that can be employed in accordance with an embodiment of the present application.

For example, the same processing steps as performed in connection with FIGS. 2-3B may also be performed in the present embodiment to provide an SOI substrate 1 having a handle substrate 10, an insulator layer 20 (e.g., BOX) disposed on the handle substrate 10 and a top semiconductor layer 30 on the insulator layer 20, and to transform the top semiconductor layer 30 into a top semiconductor portion 31 by forming an trench isolation structure 102 which laterally surrounds the top semiconductor portion 31.

Next, an insulating layer 106 may be deposited on top surfaces of the top semiconductor portion 31 and the trench isolation structure 102 can be formed in the same manner discussed in connection with FIG. 4. Further, the insulating layer 106 may be etched to form an opening 108 exposing the top surface of the top semiconductor portion 31 in the same manner discussed in connection with FIGS. 5A-5B.

Figure 10:
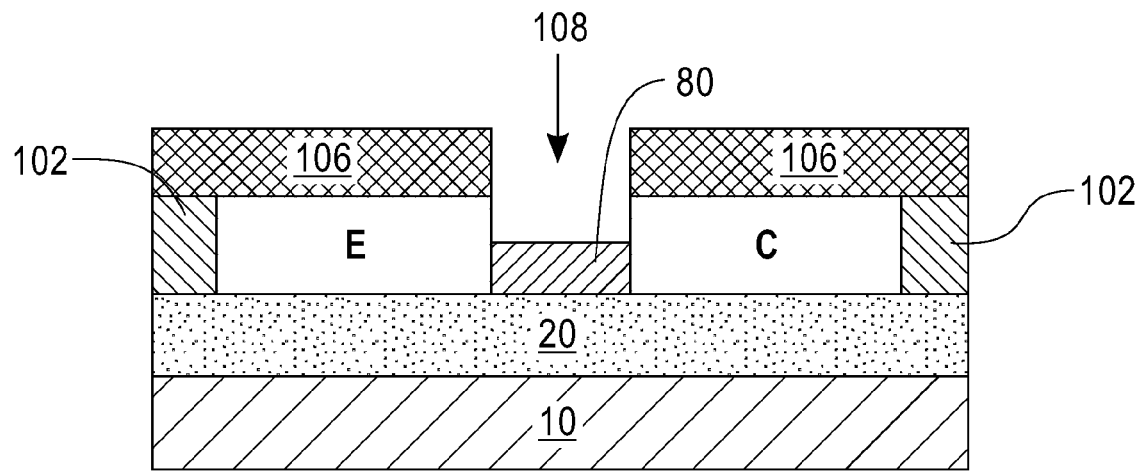
FIG. 10 is a vertical cross-sectional view of the exemplary semiconductor structure of FIGS. 5A-5B after partially recessing the top semiconductor portion to form an emitter and a collector spaced apart from each other and a seed layer in between the collector and the emitter in accordance with another embodiment of the present application.

Unlike the process step illustrated in FIG. 6 of the first embodiment of the present application, in the present embodiment illustrated in FIG. 10, the top semiconductor portion 31 is only partially recessed by the etching using the insulating layer 106 as an etch mask. Thus, in the present embodiment, the partial recessing of the top semiconductor portion 31 forms the emitter E and the collector C spaced apart from each other on the insulator layer 20 and leaves a seed layer 80 (e.g., silicon) on the insulator layer 20 between the emitter E and the collector C. The seed layer 80 constitutes a remaining portion of the top semiconductor portion 31.

Next, the seed layer 80 is counter-doped by ion implantation to form the intrinsic base of the lower bipolar transistor. Counter doping is a process by which a semiconductor region is converted from one conductivity type to an opposite conductivity type. For an NPN bipolar transistor, the seed layer 80 is converted to a p-type conductivity by ion implantation of a p-type dopant such as boron into the seed layer 80. For a PNP bipolar transistor, the seed layer 80 is converted to an n-type conductivity by ion implantation of an n-type dopant such as, for example, arsenic or phosphorus into the seed layer 80.

Figure 11:
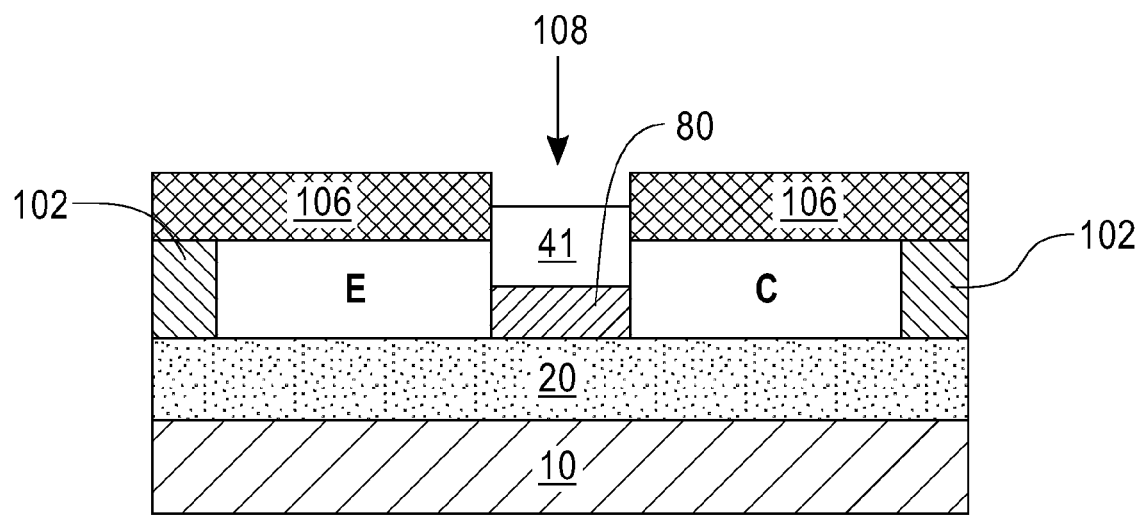
FIG. 11 is a vertical cross-sectional view of the exemplary semiconductor structure of FIG. 10 after performing an epitaxial growth process to form an intrinsic base on a top surface of the seed layer from an inner vertical sidewall of the emitter, an inner vertical sidewall of the collector and the top surface of the seed layer.

Next, an epitaxial growth process is performed using the seed layer 80 as shown in FIG. 11 as a growth layer to form the intrinsic base 41. In the present embodiment, the intrinsic base 41 is epitaxially grown from the inner vertical sidewall 70 of the emitter E, from the inner vertical sidewall 72 of the collector C and from a top surface of the seed layer 80, whereas in the first embodiment, the epitaxial growth is only from the two inner vertical sidewalls 70, 72 of the emitter E and the collector C. Other than the above-mentioned difference, essentially the same epitaxial process conditions may be used in forming the intrinsic base 41 of the present embodiment as used in forming the intrinsic base 40 discussed in connection with the first embodiment of the present application. The intrinsic base 41 may be converted to a p-type conductivity by, for example, in-situ doping or by ion implanting a p-type dopant such as boron into the intrinsic base 41 after growth.

Next, the extrinsic base 60 may be epitaxially grown from the top surface of the intrinsic base 41, and the first and second vertical spacers 50, 52 may then be formed by etching the insulating layer 106 using the extrinsic base 60 as an etching mask in the same manner discussed above in connection with FIGS. 1A-1B and 8 to thereby form the semiconductor structure 200 of the second embodiment illustrated in FIG. 9.

While the present application has been described in terms of specific embodiments, it is evident in view of the foregoing description that numerous alternatives, modifications and variations will be apparent to those skilled in the art. Each of the various embodiments of the present application can be implemented alone, or in combination with any other embodiments of the present application unless expressly disclosed otherwise or otherwise impossible as would be known to one of ordinary skill in the art. Accordingly, the present application is intended to encompass all such alternatives, modifications and variations which fall within the scope and spirit of the present application and the following claims.

What is claimed is:

1. A semiconductor structure comprising:
   an emitter and a collector spaced apart from each other and located on an insulator layer, wherein the emitter and the collector include a semiconductor material and have a doping of a first conductivity type;
   an intrinsic base disposed in between the emitter and the collector and on the insulator layer, wherein the intrinsic base includes a semiconductor material and has a doping of a second conductivity type which is opposite to the first conductivity type; and
   an extrinsic base disposed on a top surface of the intrinsic base, wherein a bottom surface of the extrinsic base has an epitaxial relationship with the top surface of the intrinsic base, wherein the intrinsic base contacts the emitter, the collector and the extrinsic base and wherein the intrinsic base has an energy band gap less than an energy band gap of the emitter and an energy band gap of the collector,
   wherein a top surface of the intrinsic base is located above a top surface of the emitter and a top surface of the collector.

2. The semiconductor structure of claim 1, further comprising
a trench isolation structure located on the insulator layer and laterally surrounding and contacting the emitter and the collector; and
a first vertical spacer located between the emitter and the extrinsic base and a second vertical spacer located between the collector and the extrinsic base, and wherein the first vertical spacer and the second vertical spacer each include a dielectric material, and wherein a first portion of the extrinsic base overlaps with the first vertical spacer and the emitter and a second portion of the extrinsic base overlaps with the second vertical spacer and the collector, and wherein the intrinsic base has an epitaxial relationship with an inner vertical sidewall of the emitter and an inner vertical sidewall of the collector.

3. The semiconductor structure of claim 2, wherein the first vertical spacer and the second vertical spacer each comprises silicon dioxide, silicon nitride, silicon oxynitride, a silicon nitride composite, or a combination thereof.

4. The semiconductor structure of claim 2, wherein the extrinsic base has an energy band gap greater than the energy band gap of the intrinsic base.

5. The semiconductor structure of claim 4, wherein the first conductivity type is an n-type conductivity and the second conductivity is a p-type conductivity, and wherein a doping concentration of the intrinsic base is less than a doping concentration of the extrinsic base.

6. The semiconductor structure of claim 2, wherein a first outer vertical sidewall of the extrinsic base is vertically aligned with an outer vertical sidewall of the first vertical spacer, and a second vertical outer sidewall of the extrinsic base is vertically aligned with an outer vertical sidewall of the second vertical spacer.

7. The semiconductor structure of claim 1, wherein the emitter and the collector include silicon (Si) and the intrinsic base includes silicon germanium (SiGe).

8. The semiconductor structure of claim 1, wherein the top surface of the emitter is coplanar with the top surface of the collector.

9. A semiconductor structure comprising:
an emitter and a collector located on an insulator layer, wherein the emitter and the collector include a semiconductor material and have a doping of a first conductivity type;
a seed layer located between and in contact with the emitter and the collector and on the insulator layer, wherein the seed layer includes a semiconductor material and has a doping of a second conductivity type opposite to the first conductivity type;
an intrinsic base located between the emitter and the collector and on a top surface of the seed layer, wherein the intrinsic base includes a semiconductor material and has a doping of the second conductivity type; and
an extrinsic base located on a top surface of the intrinsic base, wherein a bottom surface of the extrinsic base has an epitaxial relationship with the top surface of the intrinsic base, wherein the intrinsic base contacts the emitter, the collector, the seed layer, and the extrinsic base and wherein the intrinsic base has an energy band gap less than an energy band gap of the emitter and an energy band gap of the collector,
wherein a top surface of the intrinsic base is located above a top surface of the emitter and a topmost surface of the collector.

10. The semiconductor structure of claim 9, further comprising:
a first vertical spacer located between the emitter and the extrinsic base;
a second vertical spacer located between the collector and the extrinsic base, wherein the first vertical spacer and the second vertical spacer each include a dielectric material, wherein a first portion of the extrinsic base overlaps with the first vertical spacer and the emitter, and wherein a second portion of the extrinsic base overlaps with the second vertical spacer and the collector; and
a trench isolation structure located on the insulator layer and laterally surrounding and contacting the emitter and the collector.

11. The semiconductor structure of claim 10, wherein the emitter, the collector and the seed layer each include silicon and constitute a bottom transistor of the semiconductor structure, and wherein the intrinsic base includes silicon germanium and wherein the emitter, the collector and the intrinsic base constitute a top transistor which is a heterojunction bipolar transistor.

12. The semiconductor structure of claim 10, wherein a first outer vertical sidewall of the extrinsic base is vertically aligned with an outer vertical sidewall of the first vertical spacer, and a second outer vertical sidewall of the extrinsic base is vertically aligned with an outer vertical sidewall of the second vertical spacer.

13. The semiconductor structure of claim 10, wherein a bottommost surface of the emitter, a bottommost surface of the collector and a bottommost surface of the seed layer are coplanar with each other.

14. The semiconductor structure of claim 9, wherein the top surface of the emitter is coplanar with the top surface of the collector.

* * * * *